United States Patent [19]
Kitamura et al.

[11] Patent Number: 5,740,604
[45] Date of Patent: Apr. 21, 1998

[54] COMPONENT-MOUNTING APPARATUS AND METHOD

[75] Inventors: Naoyuki Kitamura, Hirakata; Hiroshi Ohta, Moriguchi; Muneyoshi Fujiwara, Katano; Wataru Hirai, Osaka, all of Japan

[73] Assignee: Matsushita Electric Industrial Co., Ltd., Osaka-fu, Japan

[21] Appl. No.: 510,679

[22] Filed: Aug. 3, 1995

[30] Foreign Application Priority Data

Aug. 3, 1994 [JP] Japan ............... 6-182020

[51] Int. Cl.$^6$ ............... H05K 3/30; B23P 19/00
[52] U.S. Cl. ............... 29/832; 29/74 D; 29/741; 29/759
[58] Field of Search ............... 29/832, 833, 740, 29/741, 759

[56] References Cited

U.S. PATENT DOCUMENTS

| | | | |
|---|---|---|---|
| 4,868,977 | 9/1989 | Maruyama et al. | 29/832 X |
| 4,999,909 | 3/1991 | Eguchi et al. | 29/740 |
| 5,086,556 | 2/1992 | Toi | 29/740 |
| 5,153,983 | 10/1992 | Oyama | 29/740 |
| 5,400,497 | 3/1995 | Watanabe et al. | 29/740 X |
| 5,402,564 | 4/1995 | Tsukasaki et al. | 29/832 |

FOREIGN PATENT DOCUMENTS

| | | | |
|---|---|---|---|
| 2-5498 | 1/1990 | Japan | 29/759 |
| 6291500 | 10/1994 | Japan | 29/832 |

*Primary Examiner*—Carl J. Arbes
*Attorney, Agent, or Firm*—Wenderoth, Lind & Ponack

[57] ABSTRACT

A component-mounting apparatus includes a component supply mechanism for supplying components to be mounted on a circuit board, a circuit board positioning device for placing in position the circuit board on which the components are to be mounted, and a mounting head for taking out one of the components at a predetermined component take-out position of the component supply mechanism, thus mounting the component on the circuit board. The component supply mechanism includes a plurality of supply tables on which a plurality of component supply devices have been arranged at predetermined intervals, a driving device for moving the supply tables in a direction in which the component supply devices have been arranged, thus placing the desired component supply device at the predetermined component take-out position, and a table exchange device provided at one end of a movable range of the supply tables to be driven by the driving device and allow the supply tables to be placed thereon and allow positions of the desired supply table to be switched by the driving device.

21 Claims, 9 Drawing Sheets

COMPONENT-MOUNTING APPARATUS AND METHOD

BACKGROUND OF THE INVENTION

The present invention relates to a component-mounting apparatus and method for mounting various kinds of components such as electronic components on a circuit board, and more particularly, to a component-mounting apparatus and method comprising a plurality of supply tables on which a plurality of component supply devices are arranged, so that a desired supply table can be selectively used.

In a conventional component-mounting apparatus, a plurality of component supply devices which is called a parts cassette on which a component tape with components arranged in a row is mounted, are set in a row on to a supply table. When mounting the components, the supply table is moved in a direction, where the component supply devices are arranged so as to: sequentially position the component supply device at a component supply position in a mounting order; take out a component from the component supply device; and mount the taken-out component on a circuit board positioned by a circuit board positioning means.

One example of such a conventional component-mounting apparatus is described below with reference to FIGS. 9 and 10.

Figure 9:
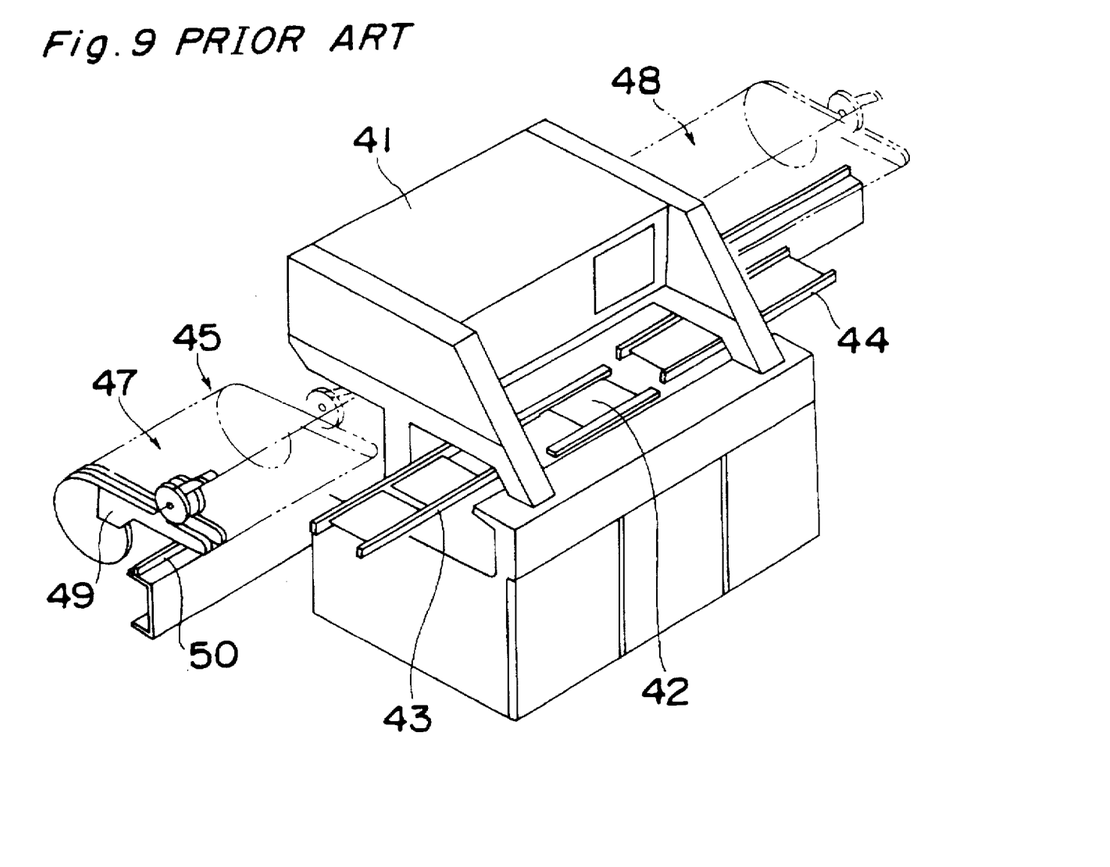
FIG. 9 is a perspective view showing a conventional component-mounting apparatus.
Figure 10:
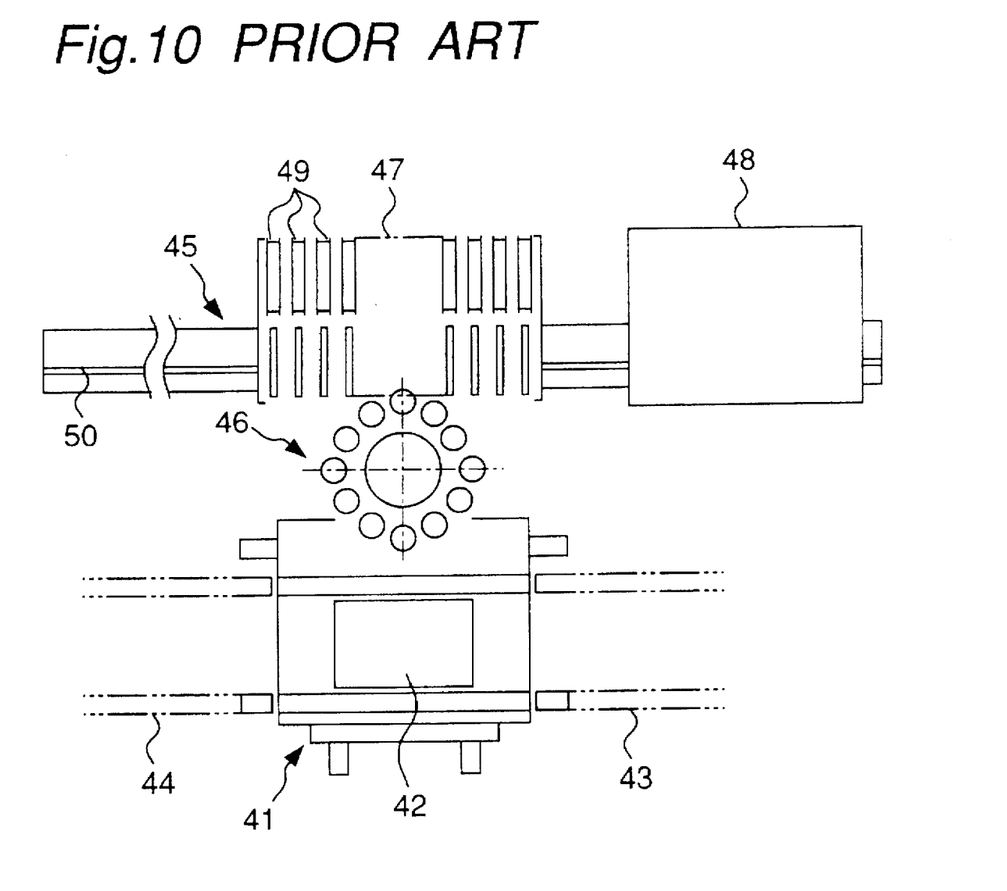
FIG. 10 is a plan view showing a schematic construction of the conventional component-mounting apparatus.

Referring to FIG. 9, the component-mounting apparatus comprises a body 41. There are provided in forward portions of the body 41 a circuit board positioning means 42 for placing in position a circuit board on which components are to be mounted; a board supply means 43 for supplying a circuit board to the circuit board positioning means 42; and a board discharge means 44 for discharging the circuit board from the circuit board positioning means 42. The component-mounting apparatus further comprises a component supply means 45 positioned in a rear portion of the body 41; and a rotary type mounting head 46 positioned between the board positioning means 42 and the component supply means 45. The mounting head 46 takes out a component at a predetermined component take-out position of the component supply means 45, thus mounting the component on the circuit board placed in position in the board positioning means 42.

In the component supply means 45, two supply tables 47 and 48 having a plurality of movable component supply devices 49 has been set thereon are provided in the direction in which the movable component supply devices 49 are arranged at predetermined intervals. The supply tables 47 and 48 are movable independently of each other along a guide rail 50. While the supply table 48 is supplying components to the mounting head 46, the supply table 47 is at a stand-by position so that at the stand-by position, the component supply devices 49 are replaced or the supply table 47 is replenished with necessary components. In this manner, the component-mounting apparatus can be allowed to be operated continuously.

In the construction of the conventional component-mounting apparatus, however, if many kinds of boards are manufactured and the amount thereof is small, there is a possibility that the operation for mounting components on the circuit board by using the supply table 48 finishes while the component supply devices 49 are replaced or the supply table 47 is replenished with necessary components. Thus, the component-mounting apparatus has a low operation rate.

Further, if many kinds of components are mounted on the circuit board and if it is necessary to supply components set on both supply tables 47 and 48 to the mounting head 46, it is impossible to make preparations for the manufacture of a different kind of board while components are being mounted on the circuit board by using the supply table 48. Thus, the component-mounting apparatus has a low operation rate. It is conceivable to set more component supply devices 49 on the supply tables 47 and 48. But the increase of the number of the component supply devices 49 causes the entire length of the component supply means 45 to be very long. As a result, the following disadvantages occur: space utilization efficiency is low and hence, production rate per area is low; and the supply tables 47 and 48 are weighty and consequently, the supply tables 47 and 48 cannot be moved fast, thus causing the component-mounting apparatus to be weighty and very expensive.

SUMMARY OF THE INVENTION

An object of the present invention is to provide compact a component-mounting apparatus and a method allowing components to be mounted on a circuit board without deteriorating an operation rate thereof, even though it is necessary to manufacture many kinds of boards in a small amount or mount many kinds of components on the circuit board.

In accomplishing these and other objects, according to one aspect of the present invention, there is provided a component-mounting apparats comprising: a component supply means for supplying components to be mounted on a circuit board; a positioning means for placing in position the circuit board on which the components are to be mounted; and a mounting head for taking out one of the components at a predetermined component take-out position of the component supply means, thus mounting the component on the circuit board, wherein the component supply means comprises: a plurality of supply tables on which a plurality of component supply devices are arranged at predetermined intervals; a driving means for moving the supply tables in a direction in which the component supply devices have been arranged, thus placing the desired component supply device at the predetermined component take-out position; and a table exchange means provided at one end of a movable range of the supply tables to be driven by the driving means and allowing the supply tables to be placed thereon and positions of the desired supply table to be switched by means of the driving means.

According to another aspect of the present invention, there is provided a method for mounting components on circuit boards, comprising steps of: supplying components to be mounted on a circuit board by a component supply means; placing in position the circuit board on which the components are to be mounted by a positioning means; and taking out one of the components at a predetermined component take-out position of the component supply means by a mounting head, thus mounting the component on the circuit board, the supplying step comprising steps of: moving, by a driving means, a plurality of supply tables, on which a plurality of component supply devices are arranged at predetermined intervals, in a direction in which the component supply devices have been arranged, thus placing the desired component supply device at the predetermined component take-out position; and allowing the supply tables to be placed thereon and positions of the desired supply table to be switched by means of the driving means, by a table exchange means provided at one end of a movable range of the supply tables to be driven by the driving means.

According to the invention, the driving means moves and places the desired supply table at the component take-out position. Then, a component is taken out from the component supply device by the mounting head to mount the component on the circuit board. During the component-mounting operation, the other supply tables placed in the stand-by position are replenished with components in preparation for the start of the manufacture of a different kind of board. The plural supply tables may be simultaneously used for mounting components. A plurality of supply tables are placed on the table exchange means provided at one end of the movable range of the supply tables, the movable positions of which can be switched by the driving means. Thus, the component-mounting apparatus is space-saving even though the apparatus has an increased number of the supply tables. A component-mounting operation can be continued without stopping the apparatus, even though it is necessary to promptly make preparations for the start of the manufacture of a different kind of board, in manufacturing many kinds of boards in a small amount. Further, when it is necessary to manufacture many kinds of components on the circuit board and hence use a plurality of supply tables, preparations for the start of the manufacture of a different kind of board can be accomplished. Thus, the component-mounting apparatus has an improved operation rate.

The table exchange means comprises the elevation member which allows the supply tables to be placed and moved vertically therein. This construction allows the area occupied by the apparatus to be equal to that occupied by the conventional one, supposing that the apparatus has an increased number of the supply tables. Accordingly, the space to be occupied by the component-mounting apparatus may be reduced.

The supply tables can be exchanged with each other together with the table exchange means removably mounted on the table exchange means. Thus, the component-mounting apparatus has an improved operation rate.

Further, the information storing means is provided on the table replacing means or the supply table, and the information reading means reads information stored by the information storing means. This construction omits the provision of a separate process of reading the information stored by the information storing means, thus improving the operation rate of the apparatus. The information read by the information reading means is utilized to check the kind of a component in the component supply means, correct an operation according to the kind of the component, and the like.

BRIEF DESCRIPTION OF THE DRAWINGS

These and other objects and features of the present invention will become clear from the following description taken in conjunction with the preferred embodiments thereof with reference to the accompanying drawings, in which.

DETAILED DESCRIPTION OF THE PREFERRED EMBODIMENTS

Before the description of the present invention proceeds, it is to be noted that like parts are designated by like reference numerals throughout the accompanying drawings.

A component-mounting apparatus according to an embodiment of the present invention is described below with reference to FIGS. 1 through 7.

Figure 1:
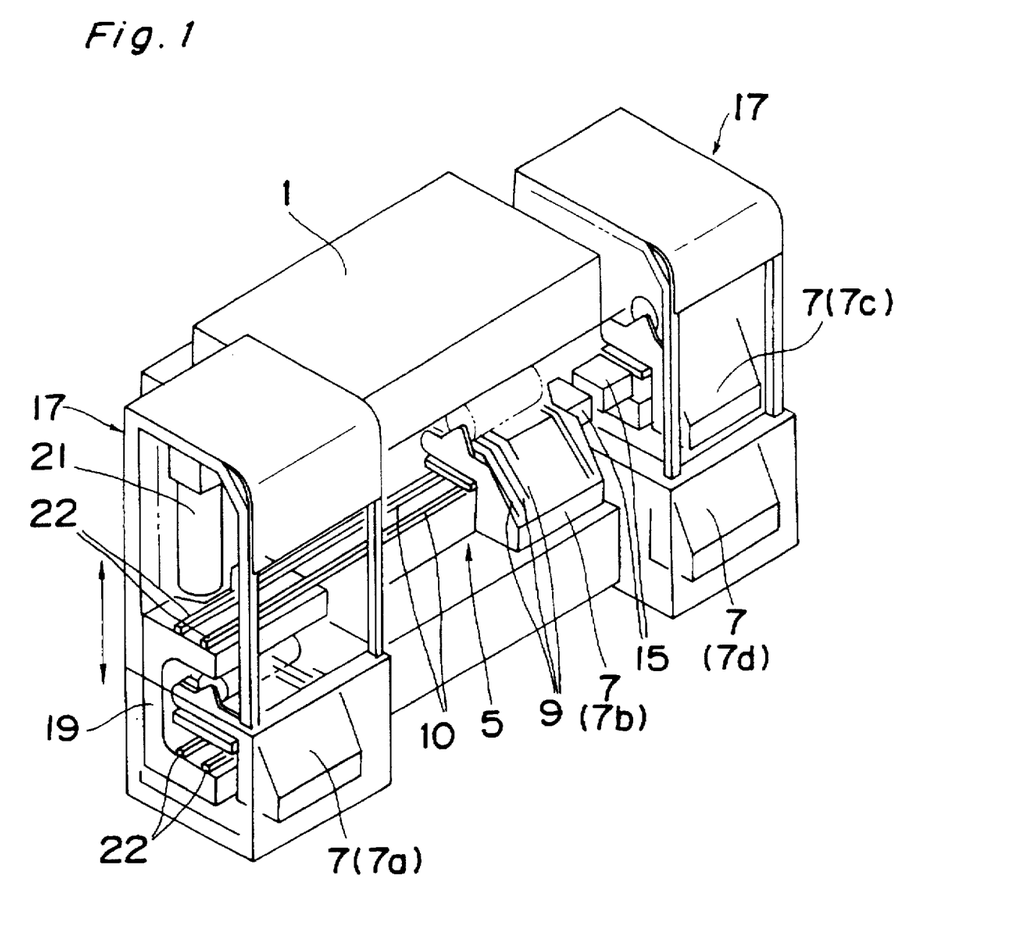
FIG. 1 is a perspective view showing a component-mounting apparatus according to an embodiment of the present invention and capable of performing a component mounting method according to an embodiment of the present invention as viewed from the rear side thereof.
Figure 2:
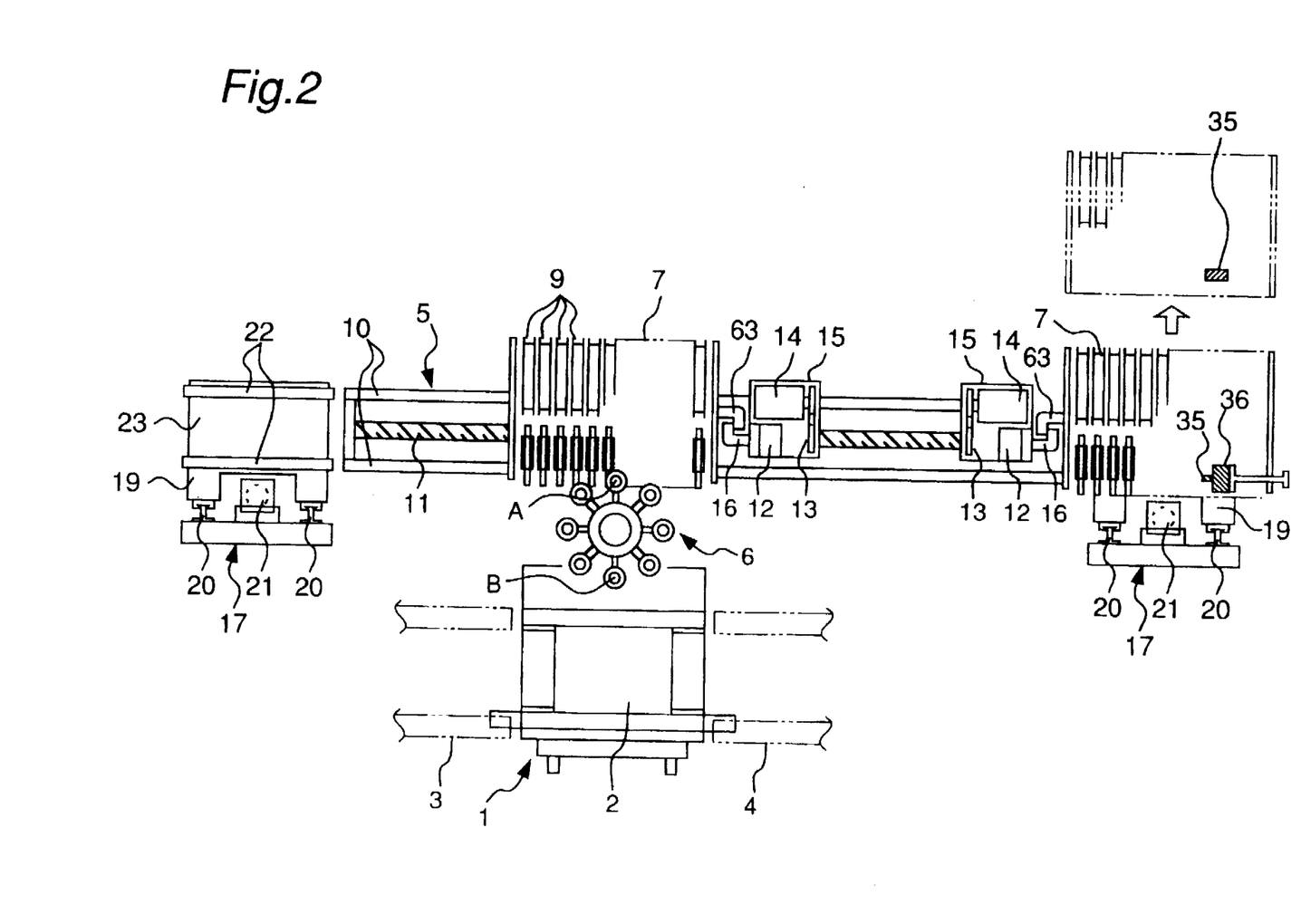
FIG. 2 is a plan view showing a schematic construction of the component-mounting apparatus according to the embodiment of the present invention.

The component-mounting apparatus comprises a body 1. There are provided, in forward portions of the body 1, a circuit board positioning means 2 for placing a circuit board on which components are to be mounted at a predetermined component mounting position (B); a circuit board supply means 3 for supplying the circuit board to the circuit board positioning means 2; and a circuit board discharge means 4 for discharging the circuit board from the circuit board positioning means 2. The component-mounting apparatus further comprises a component supply means 5 positioned in a rear portion of the body 1 ; and a rotary type mounting head 6 positioned between the circuit board positioning means 2 and the component supply means 5. Each mounting head 6 takes out a component at a predetermined component take-out position (A) of the component supply means 5, thus mounting the component on the circuit board at the predetermined component mounting position (B).

There are provided in the component supply means 5 four supply tables 7a through 7d on which a plurality of component supply devices 9 are set at predetermined intervals. Along guide rails 10, the desired supply table 7a, 7b, 7c, or 7d is selectively moved in the direction in which the component supply devices 9 have been arranged. In order to move the supply table 7a, 7b, 7c, or 7d, a ball thread 11 is provided along the guide rails 10, and two driving means 15 are provided. Each driving means 15 has a nut 12 for engaging the ball thread 11 and a driving motor 14 for rotating the nut 12 via an interlocking means 13 comprising a pulley. The driving means 15 is provided with a connection means 16 disconnectably connected with each supply table 7 which is moved along the guide rails 10.

A stand-by position is provided at each end of the guide rails 10 so that while the production of a circuit board is being performed by using the supply table 7b, the other supply tables 7a, 7c, and 7d placed in the stand-by positions are replenished with components or components are replaced with each other in preparation for the start of the manufacture of a different kind of circuit board. Thus, when components set on the supply table 7b (7c) have been exhausted or a different kind of circuit board is manufactured subsequently, the supply table 7b is replaced with the supply table 7a, 7c, or 7d. A table exchange means 17 is provided at each stand-by position. Each table exchange means 17 comprises an elevation member 19 on which two supply tables 7a and 7b or 7c and 7d can be placed vertically, as shown in FIG. 1. Each elevation member 19 is driven by a driving means 21 comprising a cylinder or a driving motor, such that each elevation member 19 is movable vertically along elevation guides 20. The elevation member 19 is positioned at an upper stop position by bringing a pad 17c fixed to the elevation member 19 into contact with a stopper 17b fixed to a frame 17a of the table exchange means 17. Also, the elevation member 19 is positioned at a lower stop position by bringing a pad 17d fixed to the elevation member 19 into contact with the stopper 17b fixed to the frame 17a of the table exchange means 17. Guide rails 22 for moving the supply tables 7a, 7b, 7c, or 7d between the guide rails 22 and 10 are provided on upper and lower stages of the elevation member 19.

Figure 3:
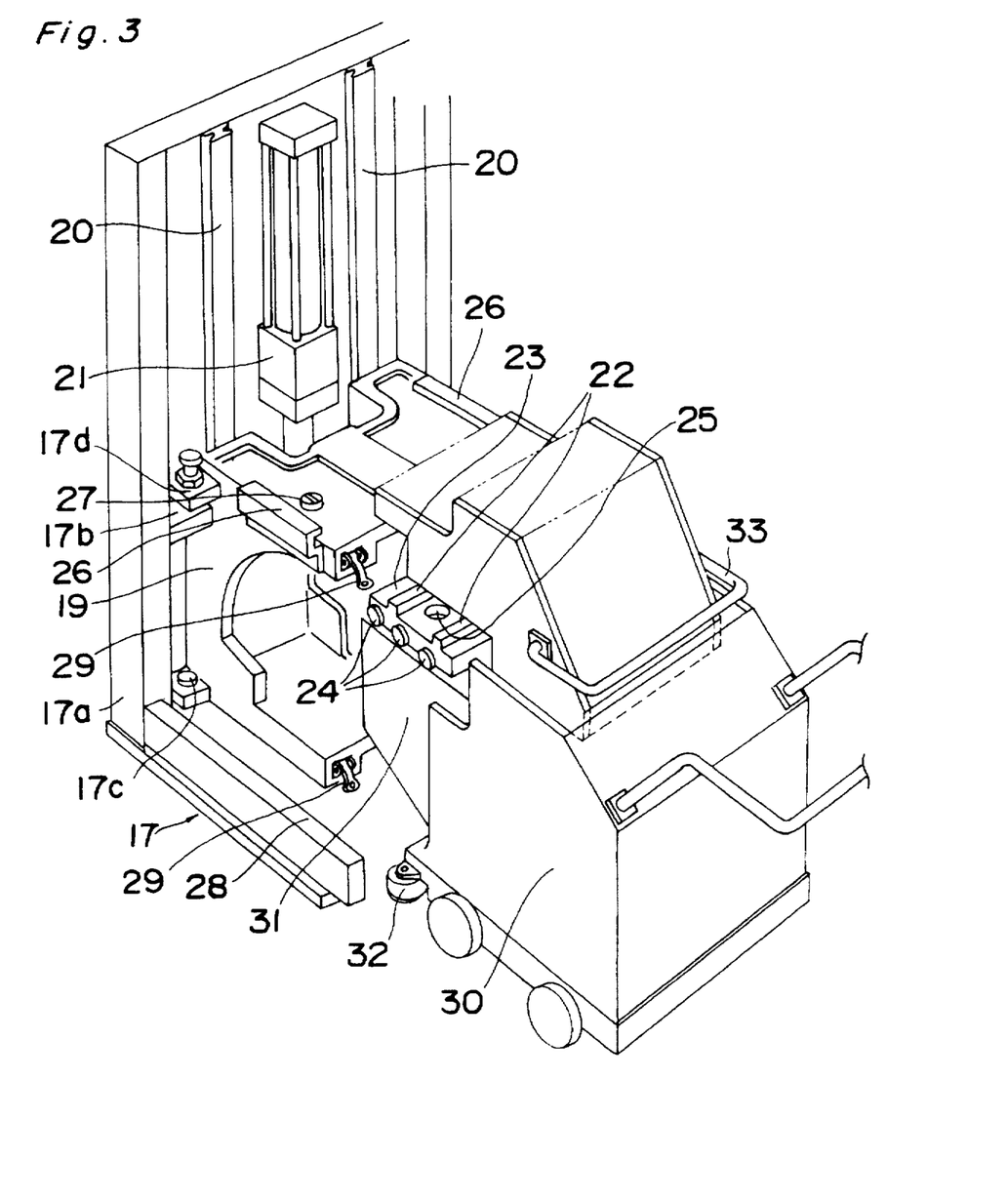
FIG. 3 is a perspective view showing a process of mounting a table replacing plate on a table exchange means and removing the table replacing plate therefrom according to the embodiment of the present invention.

The detailed construction of the table exchange means 17 is described below with reference to FIG. 3. A table replacing plate 23 is removably mounted on the upper and lower stages of the elevation member 19 toward the front thereof. The guide rails 22 are provided on the table replacing plate 23 so that the supply table 7 can be removably mounted on the elevation member 19, with the supply table 7 set on the table replacing plate 23.

That is, the table replacing plate 23 is rearwardly removed from the elevation member 19 by means of an arm 31 installed on a wagon 30 in exchange for another table replacing plate 23 on which the supply table 7 having the component supply devices 9 set thereon has been set. Such another table replacing plate 23 is placed on the wagon 30 to move the table replacing plate 23 to a rear portion of the table exchange means 17. A pair of regulation rollers 32 fixed to the two front corners of the wagon 30 is engaged by regulation portions 28 formed on a lower portion of the frame of the table exchange means 17 so as to place the wagon 30 in position. A guide bar 33 is pushed forward to place in position the table replacing plate 23 on the elevation member 19 by engagably inserting guide rollers 24 positioned on both left and right sides of the table replacing plate 23 into vertical regulation blocks 26. A regulation pin 27 is inserted into a regulation hole 25 formed on the table replacing plate 23, and thus the table replacing plate 23 is fixed to the upper stage of the elevation member 19 by using clampers 29, and finally, the wagon 30 is returned to the original position. In this manner, the required supply tables 7 are replaced with each other. The regulation pin 27, the vertical regulation blocks 26, and the clampers 29 are also arranged on the lower stage of the elevation member 19 but are not shown in FIG. 3 for simplification.

Referring to FIG. 2, the table replacing plate 23 has an information storing means 35 such as an IC card and a bar code, and the table exchange means 17 has an information reading means 36 for reading information stored by the information storing means 35, when the table replacing plate 23 is replaced with another one. Information to be stored by the information storing means 35 includes the kinds of circuit boards to be manufactured, the contents (kinds) of components to be mounted on circuit boards, and an offset amount to be used to place the supply table 7 in position. The information read by the information reading means 36 is transmitted to a controller 80 of the body 1 by an unshown communication means to correct the component take-out position (A) and check the kinds of components set in the component supply means 5 before the production of circuit boards is started. The information storing means 35 may be provided on the supply table 7 placed on the table replacing plate 23.

The connection and disconnection between the driving means 15 and the supply table 7 will be described below with reference to FIGS. 4, 5, 6, and 7.

Figure 4:
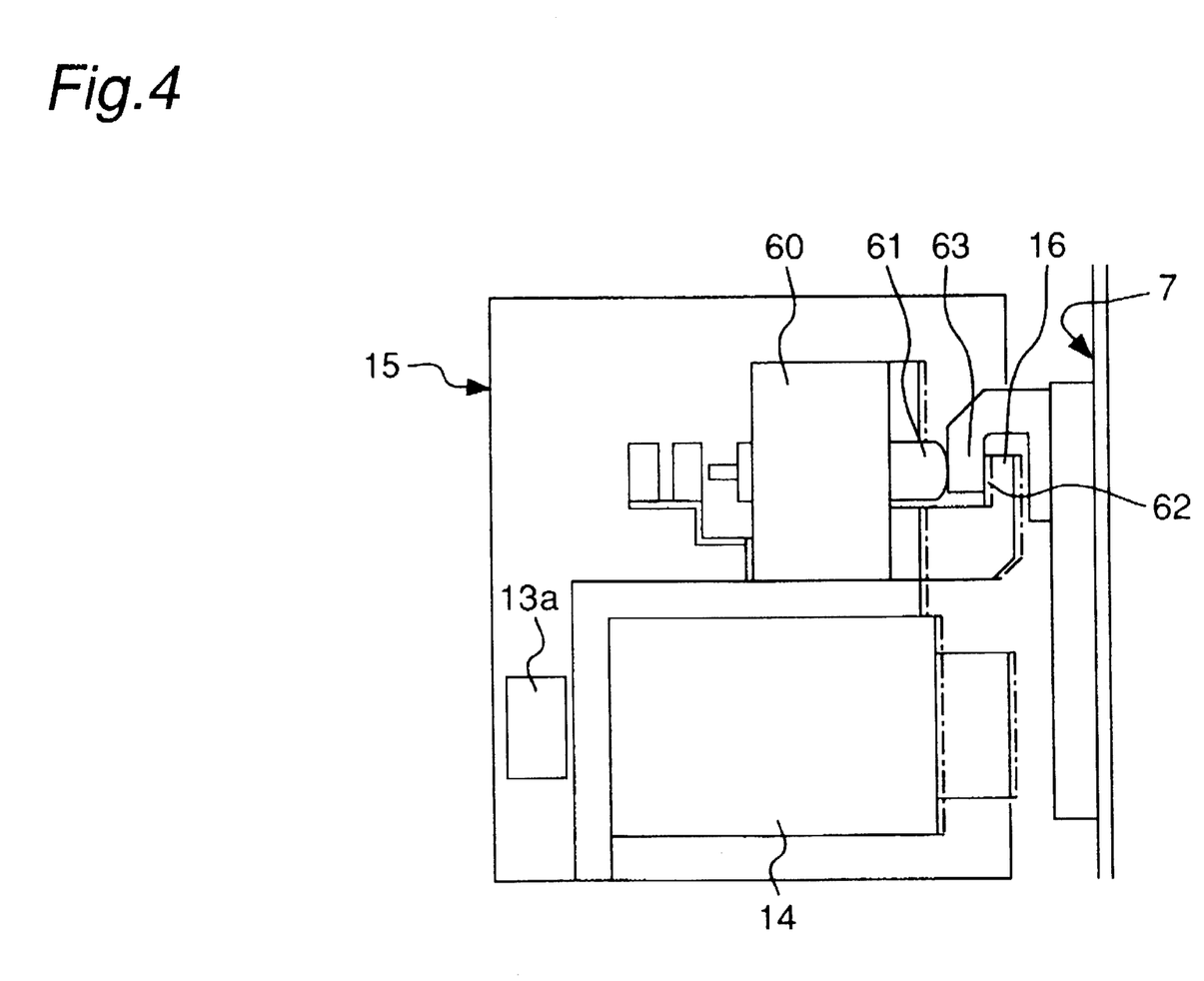
FIG. 4 is a plan view showing a connecting part of the apparatus.

In FIG. 4, reference numeral 60 denotes a cylinder, 61 a piston rod of the cylinder 60, 63 an L-shaped connecting member of the supply table 7c for engaging an L-shaped connecting member 16 which is one example of the connection means 16 of the driving means 15, and 62 a gap initially formed between the connecting members 16 and 62.

When the connecting member 16 of the driving means 15 engages the connecting member 63 of the supply table 7c positioned at the stand-by position, a bent end of the connecting member 63 of the supply table 7c is inserted into a gap between an end of the piston rod 61 and a bent end of the connecting member 16 of the driving means 15 while the supply table 7c is vertically moved by the driving means 21 and, and at this time, the gap 62 is formed between the bent ends of the connecting members 16 and 63. Then, the cylinder 60 drives to move the piston rod 61 to the connecting member 63 of the supply table 7c, contact the piston rod 61 with the connecting member 63, and moreover the piston rod 61 presses the connecting member 63 against the connecting member 16. When the piston rod 61 presses the connecting member 63 against the connecting member 16, the driving means 15 is moved away from the supply table 7c by a very small amount so as to remove the gap 62 initially formed between the connecting members 16 and 63 and contact the connecting members 16 and 63 with each other. Then, the connection between the driving means 15 and the supply table 7c is performed and the driving means 15 can move the supply table 7c.

When the connecting member 16 is disengaged from the connecting member 63, the piston rod 61 is moved away from the connecting member 63 in the opposite direction and then the driving means 15 is moved by a very small amount to approach the supply table 7c so as to form the gap 62 between the connecting members 16 and 63 while the connecting member 16 is removed from the connecting member 63. Thus, the supply table 7c is disconnected from the driving means 15 and the supply table 7c can be vertically moved by the driving means 21.

Figure 5:
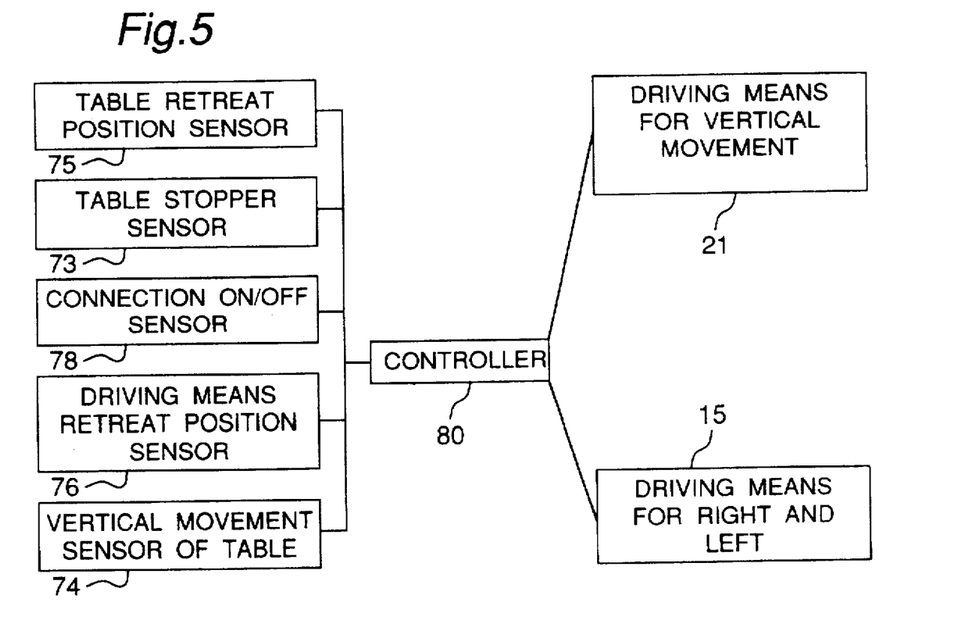
FIGS. 5 and 6 are a block diagram and a schematic plan view of the relationship between sensors, a controller, and the driving mechanism of the apparatus.
Figure 6:
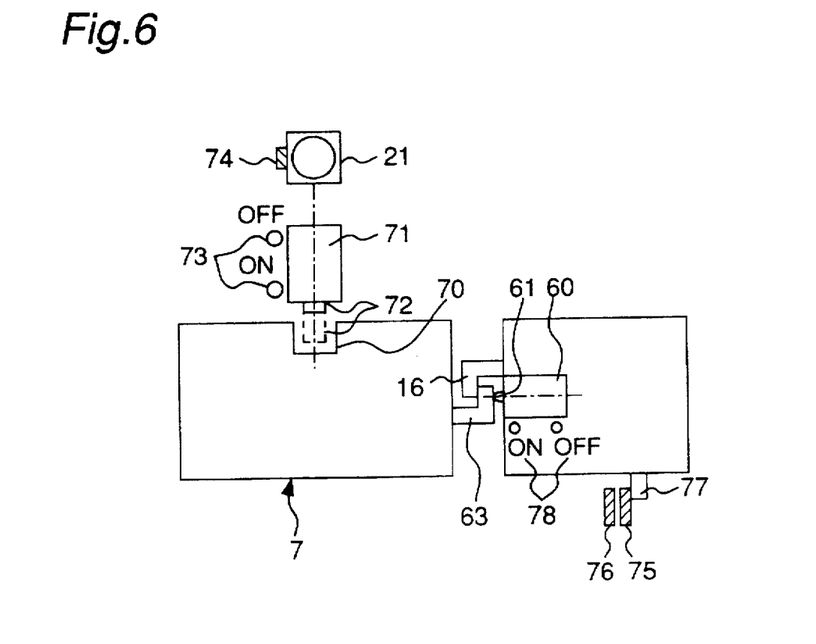

In order to perform the above operation automatically, there is provided a control part as shown in FIGS. 5 and 6. In FIGS. 5 and 6, reference numeral 71 denotes a cylinder serving as a stopper for surely stopping the supply table 7 at the stand-by position, 72 a piston rod of the cylinder 71, 73 a table stopper sensor for detecting a position of the rod 72, 74 a vertical movement sensor for detecting a vertical movement of the supply table 7 at the stand-by position by detecting a vertical position of a piston rod of the cylinder as the driving means 21, 75 a table retreat position sensor for detecting that the supply table 7 is moved to the stand-by position by the driving means 15, 76 a driving means retreat position sensor for detecting that the driving means 15 is moved to a retreat position, 77 a projection fixed to the driving means 15 for being detected by the sensors 75 and 76, and 78 a connection on/off sensor for detecting connection and disconnection between the connecting members 16 and 63 by detecting a position of the piston rod 61 of the cylinder 60. When the supply table 7 is positioned at the stand-by position by the driving means 15, the piston rod 72 of the cylinder 71 is projected into and engaged in a recess 70 of the supply table 7 at the stand-by position so as to prevent the supply table 7 from moving from the stand-by position and hold the supply table 7 at the position. When the supply table 7 is moved from the stand-by position, the piston rod 72 of the cylinder 71 is removed from the recess 70 of the supply table 7. The connection on/off sensor 78 detects by the position of the piston rod 61 of the cylinder 60 whether or not the rod 61 is projected and is contacted with and pressed against the connecting member 63 for the connection and whether or not the rod 61 is moved away from the connecting member 63 to a disconnection position for the disconnection. An example of the sensor 75 is a light detecting sensor for detecting that when a detecting light is shut by the projection 77 of the driving means 15, the driving means 15 is positioned at the table retreat position. An example of the sensor 76 is a light detecting sensor for detecting that when a detecting light is shut by the projection 77 of the driving means 15, the driving means 15 is positioned at the driving means retreat position. The detected signals from the sensors 75, 73, 78, 76, 74 are inputted into the controller 80 and driving signals are outputted from the controller 80 to the driving means 21 and 15. Into the controller 80 the information read by the information reading means 36 is also inputted.

Figure 7:
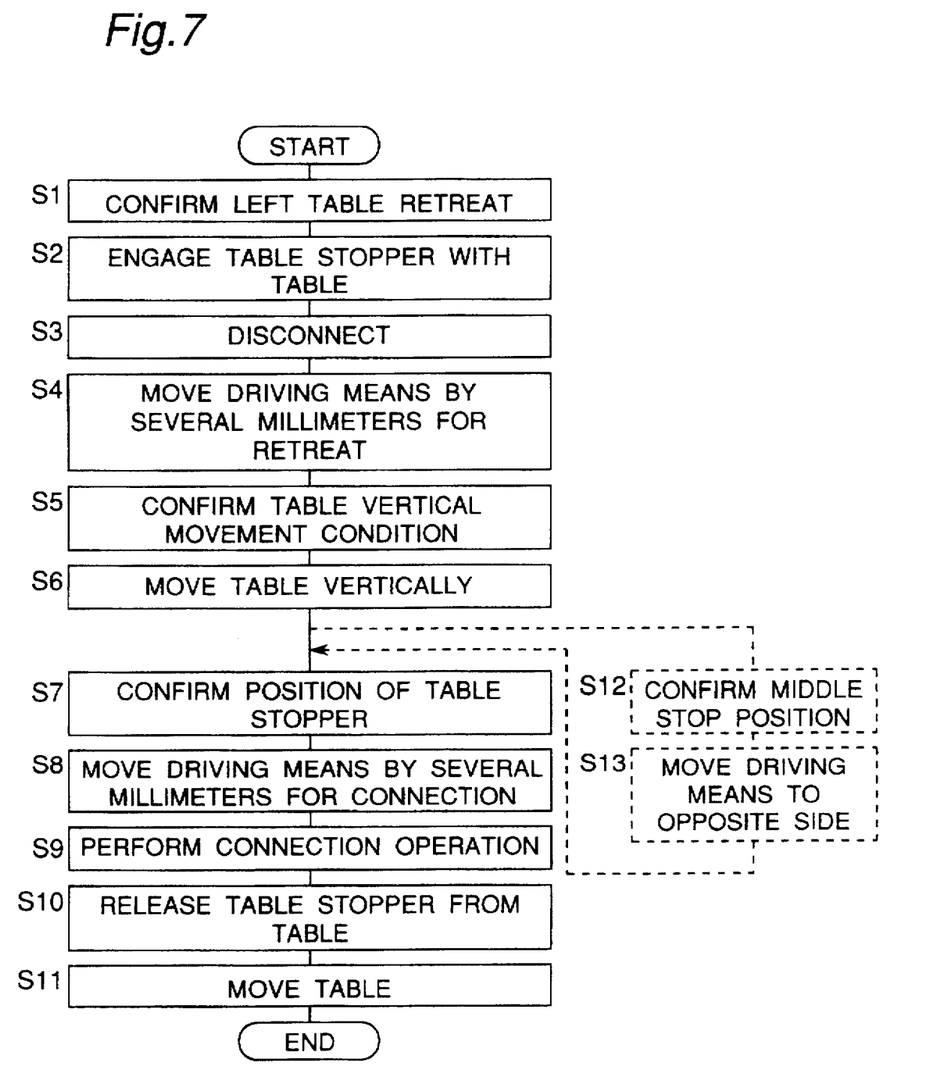
FIG. 7 is a block diagram showing an operation of the apparatus.

FIG. 7 shows a flow chart to perform the above connection and disconnection operation of the left supply tables 7a and 7b in FIG. 1. The operation of the right supply tables 7c and 7d is performed in the same manner as described below.

At step S1, the controller 80 confirms whether or not the left supply table 7b is retreated to the left stand-by position by the driving means 15. That is, the controller 80 decides whether the table retreat position sensor 75 detects the driving means 15. Then, at step S2, the controller 80 decides whether the table stopper sensor 73 detects the engagement between the piston rod 72 of the cylinder 71 and the recess 70 of the supply table 7b. That is, it is confirmed by the table stopper sensor 73 that the piston rod 72 of the cylinder 71 as the table stopper is inserted and engaged into the recess 70 of the supply table 7a at the stand-by position. Then, at step S3, the controller 80 confirms whether the connection on/off sensor 78 detects the disconnection between the connecting members 16 and 63. That is, the piston rod 61 of the cylinder 60 is driven so as to move away from the connecting member 63 and the connection on/off sensor 78 detects that the piston rod 61 moves to the disconnect position. At step S4, the controller 80 confirms whether the driving means 15 moves to approach the supply table 7b by a small amount such as several millimeters and the gap 62 is formed between the connecting members 16 and 63. This movement of the driving means 15 is detected by the driving means retreat position sensor 76. At this time, the supply table 7b is stopped at the stand-by position by the engagement between the piston rod 72 and the recess 70 and thus, the supply table 7b is not moved when the driving means 15 moves and only the driving means 15 moves. At step S5, the controller 80 confirms the condition wherein the supply table 7b moves downward immediately or after a specified time of period, the supply table 7b is moved downward or other conditions are set based on inputted information and stored information. If it is decided by the controller 80 that the downward movement of the supply table 7b is allowed, at step S6, the supply table 7b is moved vertically downward by the driving means 21 and the supply table 7b has reached the downward position by the vertical movement sensor 74. And then, for example, after the downward movement, the supply table 7b is exchanged with a new supply table 7b with components replenished. Or, instead of the supply table 7b, the supply table 7a is used for next mounting.

Then, the supply table 7a or 7b is connected to the driving means 15 at steps S6 through S11. At step S6, the supply table 7b or 7a which is to be used is vertically moved upward and positioned it the stand-by position where the supply table is capable of being connected to the driving means 15 and the piston rod 72 of the cylinder 71 is engaged with the recess 70 of the supply table 7b or 7a. This is confirmed by the controller 80 in accordance with the detection of the vertical movement sensor 74. At step S7, the controller 80 confirms that the piston rod 72 of the cylinder 71 is projected to be engaged with the recess 70 of the supply table 7 based on the detection of the table stopper sensor 73. Then, at step S8, the controller 80 confirms the small amount of movement of the driving means 15. That is, the driving means 15 is moved by a small amount such as several millimeters away from the supply table 7 until the driving means 15 is detected by the table retreat position sensor 75 and thus the gap 62 formed between the connecting members 16 and 63 is removed therefrom and thus the connecting members 16 and 63 contact with each other. Then, at step S9, the controller 80 confirms the connection of the connecting members 16 and 63 based on the detection of the connection on/off sensor 78. That is, the piston rod 61 of the cylinder 60 is driven and contacts the connecting member 63 to surely engage the connecting members 16 and 63 with each other. Then, at step S10, the controller 80 confirms the disengagement of the supply table 7 and the cylinder 71. That is, the piston rod 72 of the cylinder 71 is retreated from the recess 70 of the supply table 7 and this is detected by the table stopper sensor 73. Then, at step S11, the controller 80 drives the driving means 15 to move the supply table 7 from the stand-by position to the component take-out position (A).

During the exchange of the supply table 7b, the supply table 7c or 7d is positioned at the component take-out position (A) to take out the component on the supply table 7b by each mounting head 6 and mount the component on the circuit board at the predetermined component mounting position (B).

A component-mounting operation to be performed by the component-mounting apparatus having the above-described construction is described below. The driving means 15 is operated to move, along the guide rails 10, the desired supply table 7a, 7b, 7c, or 7d placed on the left and right table exchange means 17 so as to place the desired component supply devices 9 set on the supply table 7 at the component take-out position (A). Then, components are taken out from the component supply device 9 by the mounting head 6 to mount the components on the circuit board placed at the predetermined component mounting position (B) of the circuit board positioning means 2. During the component-mounting operation, the other supply tables placed in the stand-by positions are replenished with components in preparation for the start of the manufacture of a different kind of circuit board.

When it is necessary to mount many kinds of components on a circuit board, the driving means 15 is operated to move, the desired supply table 7a, 7b, 7c, and 7d set on both table exchange means 17, along the guide rails 10. In this manner, components are taken out from a plurality of supply tables 7 to mount them on the circuit board.

A description will now be made of examples of patterns (four patterns) used in setting components on the supply tables 7a through 7d.

According to a first pattern, a plurality of kinds of components to be mounted on a plurality of kinds of circuit boards are set on the supply tables 7a through 7d. In starting the manufacture of a different kind of circuit board, the supply tables 7 are replaced with each other by using the table exchange means 17. This pattern is used when many kinds of circuit boards are manufactured in a small amount and then it is necessary to frequently replace one of the supply tables 7 with the other, and thus allows the component-mounting apparatus to have an improved operation rate.

According to a second pattern, the same kind of components corresponding to a first kind of circuit board are set on the supply tables 7a and 7b, whereas the same kind of components corresponding to a second kind of circuit board are set on the supply tables 7c and 7d. If components on either the supply table 7a or the supply table 7b have been exhausted, the supply table 7a and the supply table 7b are replaced with each other. Similarly, if components on either the supply table 7c or the supply table 7d has been exhausted, the supply tables 7c and 7d are replaced with each other. The second pattern allows the production of circuit boards to be continuously performed by replacing one of the supply tables with the other to replenish components in the above manner even when the one of the supply tables has no components, and the supply tables placed in the stand-by positions to be replenished with components or to make preparations for the start of the manufacture of a different kind of circuit board, thus improving an operation rate of the component-mounting apparatus.

According to a third pattern, various kinds of components corresponding to a first kind of circuit board are set on the supply tables 7a and 7b, whereas various kinds of components corresponding to a second kind of circuit board are set on the supply tables 7c and 7d. The third pattern allows the replacement of a different kind of component to be accomplished promptly when it is necessary to mount many kinds of components thereon. Thus, the third pattern allows the component-mounting apparatus to have an improved operation rate.

In the third pattern, it is possible to set components corresponding to the same kind of circuit board on all of the supply tables 7a, 7b, 7c, and 7d so that if the supply tables 7a and 7b are being used, the supply tables 7c and 7d are placed at the stand-by position. Further, it is possible for the supply tables 7b and 7c and the supply tables 7a and 7d to make a pair, respectively.

According to a fourth pattern, a different kinds of components are set on the supply tables 7a, 7b, and 7c, and only one kind of components, as common components, is set on the supply table 7d.

In addition to the above-described four patterns, various types of component-mounting operations can be accomplished by setting components on the supply tables in more patterns.

According to the embodiment, each table replacing 17 means comprises the elevation member 19 and thus can be installed on the position corresponding to the stand-by position of the conventional supply table even though the apparatus has three or more supply tables. That is, the area to be occupied by the component-mounting apparatus according to the embodiment is equal to that occupied by the conventional one. Accordingly, the vertical space to be occupied by the component-mounting apparatus according to the embodiment is smaller than that to be occupied by the conventional one which comprises a movable member which moves horizontally, if that apparatus has an increased number of the supply tables.

In addition, the supply tables 7 are replaceable with each other together with the table replacing plate 23 by removably mounting the table replacing plate 23 on the table exchange means 17. Thus, the component-mounting apparatus has an improved operation rate. Further, the information storing means 35 is provided on the table replacing plate 23 or the supply table 7, and the information reading means 36 reads information stored by the information storing means 35 when the table replacing plate 23 is supplied to the table exchange means 17. This construction omits the provision of a separate process of reading the information stored by the information storing means 35, thus improving the operation rate of the apparatus.

Figure 8:
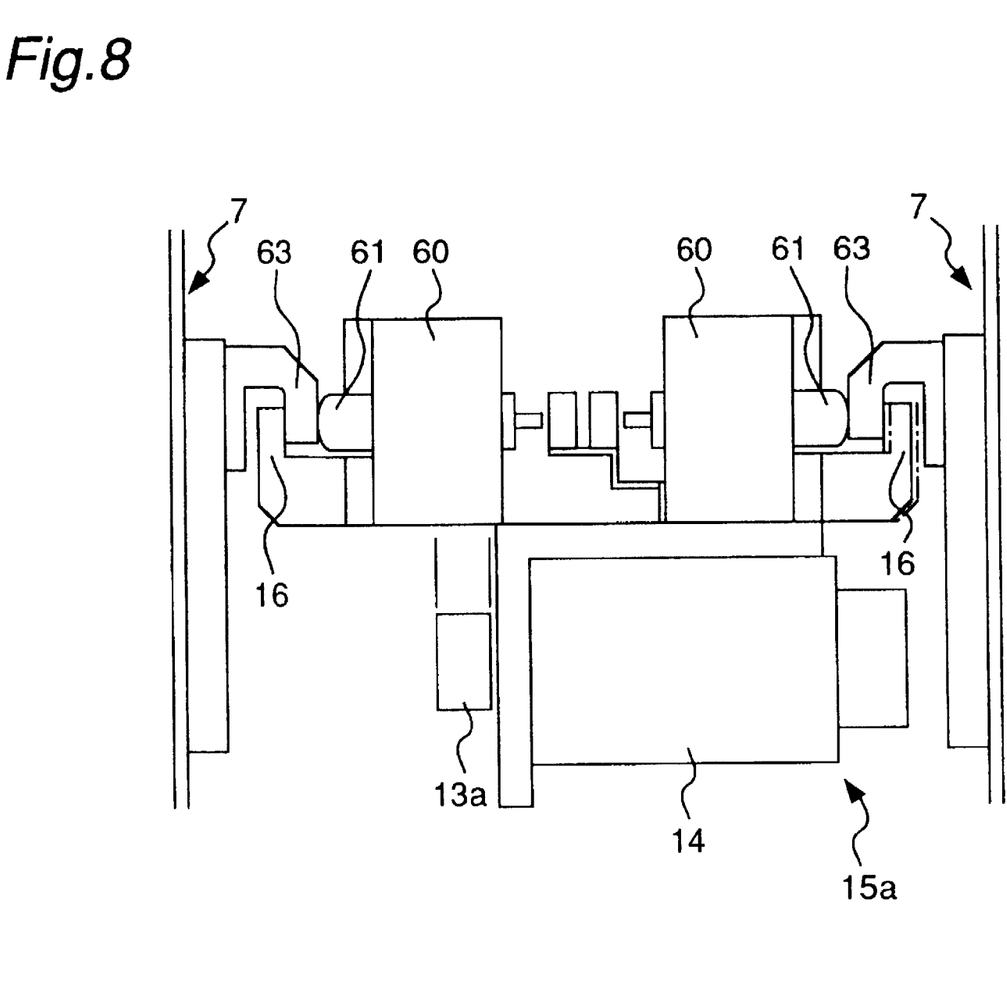
FIG. 8 is a plan view showing a connecting part of a component-mounting apparatus according to another embodiment of the present invention.

FIG. 8 is a plan view showing a connecting part of a component-mounting apparatus according to another embodiment of the present invention. Although two driving means 15 are used for the two stand-by positions in the first embodiment, only one driving means 15a may be used instead of the two driving means 15. In FIG. 8, the driving means 15a has two cylinders 60, and connecting members 16 on both sides. The operation of the driving means 15a is similar to that of the driving means 15 in the first embodiment except for the following steps. That is, as shown by dotted lines in FIG. 7, two steps S12 and S13 are added between the steps S6 and S7. At step S7, the controller 80 confirms that the driving means 15a is moved to a middle stop position between the two stand-by positions by a sensor. At step S8, the controller 80 confirms that the driving means 15a stopped at the middle stop position is moved to the opposite side of the stand-by position. That is, for example, the supply table 7a or 7b is moved to the left stand-by position by the driving means 15a and then, while the supply table 7a or 7b is vertically moved at the stand-by position, the driving means 15 is moved to the opposite side, i.e. the right stand-by position, and moves the supply table 7c or 7d to the component take-out position (A).

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. A method for mounting components on circuit boards, the method comprising:
   supplying components to be mounted on a circuit board, by a component supply mechanism;
   placing in position the circuit board on which the components are to be mounted, by a circuit board positioning device; and
   taking one of the components out of the component supply mechanism at a predetermined component take-out position of the component supply mechanism, by a component mounting head, and mounting the component on the circuit board,
   wherein said supplying of the components includes:
      moving, by a driving device, a plurality of supply tables, on which a plurality of component supply devices have been arranged at predetermined intervals, in a direction in which the component supply devices have been arranged, thus placing a desired component supply device at the predetermined component take-out position;
      placing the supply tables on a table exchange mechanism which has an elevator and is provided at one end of a movable range of the supply tables;
      switching a position of a first desired supply table by the driving device, including moving the first desired supply table vertically in the elevator.

2. The method as claimed in claim 1, wherein the plurality of supply tables includes four supply tables and the table exchange mechanism is provided at each end of the movable range of the supply tables.

3. The method as claimed in claim 1, further comprising selectively holding one of the supply tables on which the component supply devices have been set, by a table replacing device removably mounted on the table exchange mechanism.

4. The method as claimed in claim 3, further comprising reading information from an information storing device provided on the table replacing device, by an information reader provided on the table exchange device.

5. The method as claimed in claim 1, further comprising reading information from an information storing device provided on a supply table, by an information reader provided on the table exchange device.

6. The method as claimed in claim 1, wherein said switching of a position of a first desired supply table, further includes engaging an L-shaped connecting member of the driving device with an L-shaped connecting member of the first desired supply table, and pressing the connecting member of the first desired supply table, with a driving mechanism, so that the connecting members of the driving device and the supply table contact each other to remove a gap formed between the connecting members and positively connect the connecting members with each other.

7. The method as claimed in claim 6, wherein said switching of a position of a first desired supply table, further includes:

moving the supply table to a stand-by position, where the table exchange mechanism is provided, by the driving device;

stopping the driving mechanism from pressing the connecting member of the first desired supply table against the connecting member of the driving device and then moving the driving device to approach the first desired supply table so as to disengage the connecting member of the driving device from the connecting member of the first desired supply table;

vertically moving the first desired supply table from a position confronting the driving device;

switching the first desired supply table with a second desired supply table;

vertically moving the second desired supply table to the position confronting the driving device;

engaging the connecting members of the driving device and the second desired supply table and pressing the connecting member of the second desired supply table against the connecting member of the driving device by the driving mechanism; and moving the second desired supply table to the component take-out position by the driving device.

8. A component-mounting apparatus comprising:

an apparatus body;

a component supply mechanism provided on said body for supplying components to be mounted on a circuit board;

a circuit board positioning device provided on said body for placing the circuit board, on which the components are to be mounted, in position; and a component mounting head provided on said body for taking one of the components out of the component supply mechanism at a predetermined component take-out position of the component supply mechanism and mounting the component on the circuit board;

wherein said component supply mechanism comprises:

a plurality of supply tables on which a plurality of component supply devices can be arranged at predetermined intervals;

a driving device for moving said supply tables over a range and in a direction in which the component supply devices can be arranged, thus placing a desired component supply device at the predetermined component take-out position; and a table exchange mechanism provided at least one end of the moveable range of said supply tables for receiving the supply tables thereon and for allowing a position of a desired one of said supply tables to be switched by said driving device;

wherein said table exchange mechanism has an elevator which is vertically moveable between at least two positions.

9. The component-mounting apparatus as claimed in claim 8, wherein said plurality of supply tables includes three supply tables.

10. The component-mounting apparatus as claimed in claim 8, wherein said plurality of supply tables includes tour supply tables and said table exchange device is provided at each end of the movable range of said supply tables.

11. The component-mounting apparatus as claimed in claim 8, wherein said plurality of supply tables includes four supply tables, said driving device includes two driving devices, one of which moves two of said supply tables and the other of which moves the other two of said supply tables, and said table exchange mechanism is provided at each end of the movable range of said supply tables.

12. The component-mounting apparatus as claimed in claim 8, further comprising a table replacing device, removably mounted on said table exchange mechanism, for selectively holding one of said supply tables on which the component supply devices have been set.

13. The component-mounting apparatus as claimed in claim 12, wherein said table exchange mechanism is provided with an information reader for reading information from an information storing device provided on said table replacing device.

14. The component-mounting apparatus as claimed in claim 8, wherein said table exchange mechanism is provided with an information reader for reading information from an information storing device provided on each of said supply tables.

15. The component-mounting apparatus as claimed in claim 8, wherein said driving device has a connection mechanism disconnectably connectable with each of said supply tables.

16. The component-mounting apparatus as claimed in claim 15, wherein said connecting mechanism of said driving device includes an L-shaped connecting member and each of said supply tables has an L-shaped connecting member for engaging with said connecting member of said driving device, and said connecting mechanism includes a driving mechanism for pressing said connecting member of said supply table and contacting said connecting members of said driving device and said supply table with each other to remove a gap formed between said connecting members and positively connect them with each other.

17. The component-mounting apparatus as claimed in claim 8, wherein said supply tables are for receiving different kinds of components to be mounted on a plurality of kinds of circuit boards so that in starting manufacture of a different kind of the plurality of kinds of circuit boards, said supply tables are replaced with each other by using said table exchange device.

18. The component-mounting apparatus as claimed in claim 8, wherein a first one of said plurality of supply tables is for receiving a same kind of components corresponding to a first kind of circuit board, whereas a second one of said plurality of supply tables is for receiving a same kind of components corresponding to a second kind of circuit board so that when said components on said first one of said supply tables have been exhausted, said first one of said supply tables and said second one of said supply tables are replaced with each other.

19. The component-mounting apparatus as claimed in claim 8, wherein a first one of said plurality of supply tables is for receiving various kinds of components corresponding to a first kind of circuit board, whereas a second one of said plurality of supply tables is for receiving various kinds of components corresponding to a second kind of circuit board, so that when it is necessary to mount many kinds of components on a circuit board, replacement of a different kind of component in either said first or second one of said plurality of supply tables is promptly accomplished.

20. The component-mounting apparatus as claimed in claim 8, wherein a first one of said plurality of supply tables is for receiving different kinds of components, and a second one of said plurality of supply tables is for receiving only one kind of components, as common components.

21. The component mounting apparatus as claimed in claim 8, wherein said elevator is for receiving sad supply tables and vertically moving said supply tables received thereon.

* * * * *